(12) United States Patent
Ikeda et al.

(10) Patent No.: US 10,971,413 B2
(45) Date of Patent: Apr. 6, 2021

(54) PLASMA PROCESSING APPARATUS AND CONTROL METHOD

(71) Applicant: Tokyo Electron Limited, Tokyo (JP)

(72) Inventors: Taro Ikeda, Yamanashi (JP); Yuki Osada, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 211 days.

(21) Appl. No.: 15/947,994

(22) Filed: Apr. 9, 2018

(65) Prior Publication Data

US 2018/0301388 A1    Oct. 18, 2018

(30) Foreign Application Priority Data

Apr. 14, 2017   (JP) .............................. JP2017-080621

(51) Int. Cl.
*H01L 21/66* (2006.01)
*G01J 3/443* (2006.01)
(Continued)

(52) U.S. Cl.
CPC ........ *H01L 22/26* (2013.01); *C23C 16/45542* (2013.01); *C23C 16/511* (2013.01); *C23C 16/52* (2013.01); *G01J 3/443* (2013.01); *H01J 37/32972* (2013.01); *H01L 21/02274* (2013.01); *H01L 21/3065* (2013.01)

(58) Field of Classification Search
USPC .......................... 156/345.24–345.28, 345.41; 118/723 MW, 723 ME, 723 MR, 723 MA
See application file for complete search history.

(56) References Cited

U.S. PATENT DOCUMENTS 5,374,327 A * 12/1994 Imahashi ............... G01N 21/68
438/9
6,458,239 B1 * 10/2002 Bhardwaj ............. H01J 37/321
156/345.24

(Continued)

FOREIGN PATENT DOCUMENTS

JP          09-192479 A     7/1997
JP          2011-060852 A   3/2011
(Continued)

OTHER PUBLICATIONS

Machine Translation JP2013171847,Yutaka et al (Year: 2013).*

*Primary Examiner* — Rakesh K Dhingra
(74) *Attorney, Agent, or Firm* — Abelman, Frayne & Schwab

(57) ABSTRACT

Provided is a plasma processing apparatus including a microwave radiating mechanism configured to radiate microwaves output from a microwave output unit into a processing container. The microwave radiating mechanism includes: an antenna configured to radiate the microwaves; a dielectric member configured to transmit the microwaves radiated from the antenna, and form an electric field for generating surface wave plasma by the microwaves; a sensor provided in the microwave radiating mechanism or adjacent to the microwave radiating mechanism, and configured to monitor electron temperature of the generated plasma; and a controller configured to determine a plasma ignition state based on the electron temperature of the plasma monitored by the sensor.

8 Claims, 8 Drawing Sheets

(51) Int. Cl.
*C23C 16/455* (2006.01)
*H01J 37/32* (2006.01)
*H01L 21/02* (2006.01)
*H01L 21/3065* (2006.01)
*C23C 16/52* (2006.01)
*C23C 16/511* (2006.01)

(56) References Cited

U.S. PATENT DOCUMENTS

2003/0045012 A1* 3/2003 Johnson ............ H01J 37/32082
 438/14
2007/0284246 A1* 12/2007 Keil ...................... C23C 16/509
 204/298.36
2009/0311870 A1* 12/2009 Sasaki ............... H01J 37/32449
 438/719
2010/0101728 A1* 4/2010 Iwasaki ............. H01J 37/32192
 156/345.33

FOREIGN PATENT DOCUMENTS

| | | | |
|---|---|---|---|
| JP | 2013-077441 A | | 4/2013 |
| JP | 2013171847 | * | 9/2013 |
| JP | 2016-207915 A | | 12/2016 |
| KR | 10-2013-0095225 A | | 8/2013 |
| KR | 10-2016-0112988 A | | 9/2016 |

* cited by examiner

PLASMA PROCESSING APPARATUS AND CONTROL METHOD

CROSS-REFERENCE TO RELATED APPLICATIONS

This application is based on and claims priority from Japanese Patent Application No. 2017-080621, filed on Apr. 14, 2017, with the Japan Patent Office, the disclosure of which is incorporated herein in its entirety by reference.

TECHNICAL FIELD

The present disclosure relates to a plasma processing apparatus and a control method.

BACKGROUND

As one of the methods of monitoring a state of plasma, there has been known optical emission spectroscopy (OES). The optical emission spectroscopy qualitatively analyzes a wavelength of an inherent bright line spectrum (atom spectrum) of an element obtained by evaporating, vaporizing, and exciting the object element in a sample by using discharge plasma, and quantitatively analyzes light emission intensity. See, for example, Japanese Patent Application Publication Nos. 2016-207915, 09-192479, 2011-060852, and 2013-077441.

SUMMARY

To solve the aforementioned problem, according to one aspect, there is provided a plasma processing apparatus including a microwave radiating mechanism configured to radiate microwaves output from a microwave output unit into a processing container. The microwave radiating mechanism includes: an antenna configured to radiate the microwaves; a dielectric member configured to transmit the microwaves radiated from the antenna, and form an electric field for generating surface wave plasma by the microwaves; a sensor provided in the microwave radiating mechanism or adjacent to the microwave radiating mechanism, and configured to monitor electron temperature of the generated plasma; and a controller configured to determine a plasma ignition state based on the electron temperature of the plasma monitored by the sensor.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
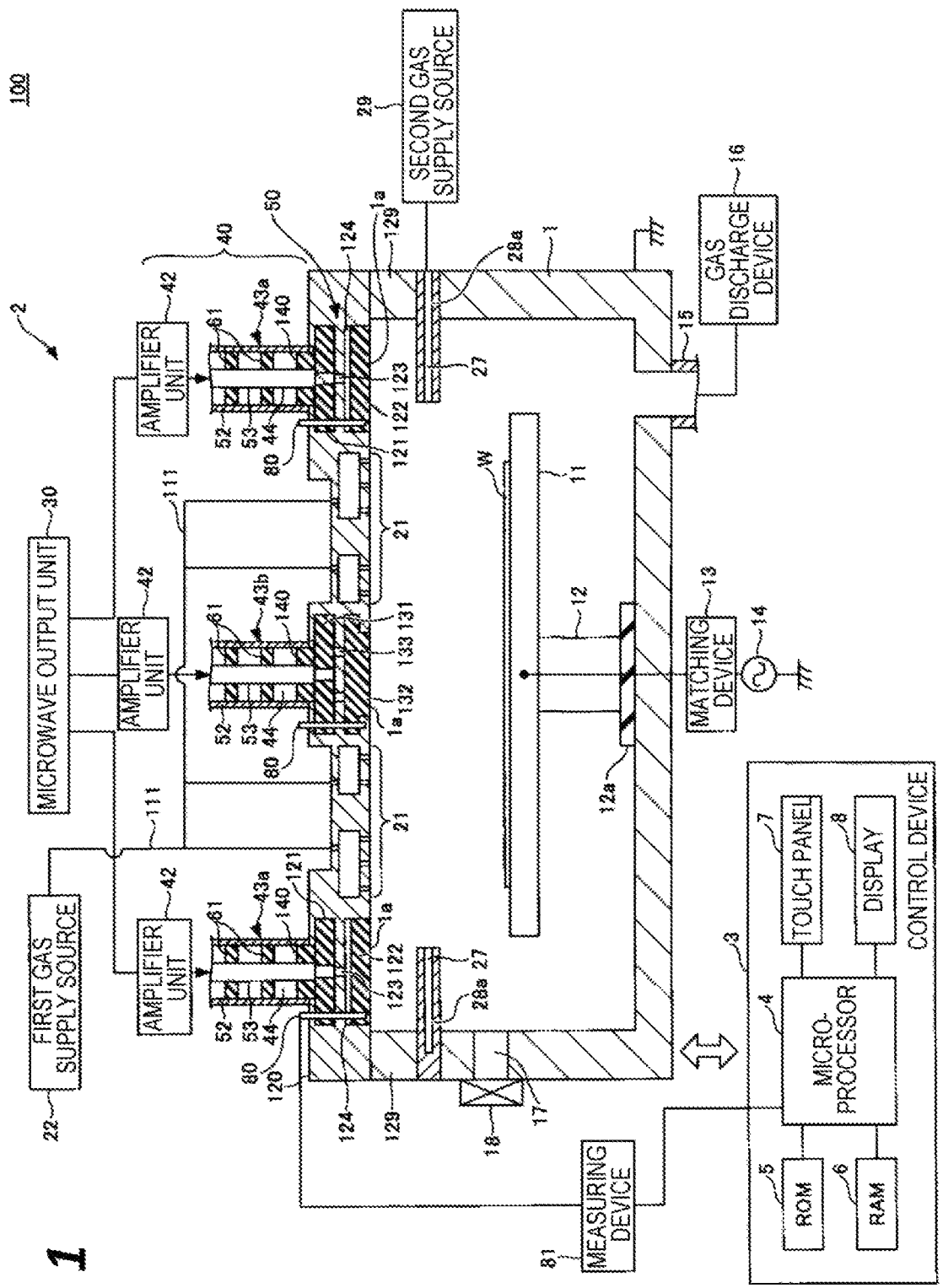
FIG. 1 is a view illustrating an example of a vertical section of a microwave plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the optical emission spectroscopy, a distribution of plasma may not be monitored because an overall state of the plasma is monitored. Therefore, in the optical emission spectroscopy, an ignition state of a part of the plasma may not be monitored even though an ignition state of the entire plasma may be monitored.

In the optical emission spectroscopy, wavelengths of light emission spectrums of different gas excited species overlap one another in some instances in a case in which multiple types of gases are supplied into a processing container, and as a result, precision is sometimes insufficient at the time of monitoring plasma characteristics.

For example, in the optical emission spectroscopy, when only plasma, which corresponds to any one of a plurality of microwave radiating mechanisms, is eliminated in a case in which microwaves are introduced into the processing container from the plurality of microwave radiating mechanisms, it is difficult to detect the elimination of the plasma.

Regarding the aforementioned problems, in one aspect, an object of the present disclosure is to monitor plasma ignition states in a plurality of regions in a plasma generating space.

To solve the aforementioned problem, according to one aspect, there is provided a plasma processing apparatus including a microwave radiating mechanism configured to radiate microwaves output from a microwave output unit into a processing container. The microwave radiating mechanism includes: an antenna configured to radiate the microwaves; a dielectric member configured to transmit the microwaves radiated from the antenna, and form an electric field for generating surface wave plasma by the microwaves; a sensor provided in the microwave radiating mechanism or adjacent to the microwave radiating mechanism, and configured to monitor electron temperature of the generated plasma; and a controller configured to determine a plasma ignition state based on the electron temperature of the plasma monitored by the sensor.

In the above-described plasma processing apparatus, N microwave radiating mechanisms are disposed in a circumferential direction of a ceiling plate of the processing container, in which N≥2, M sensors are provided, in which M equals to N or a multiple of N, and the controller determines the plasma ignition states corresponding to the N microwave radiating mechanisms based on the electron temperature of the plasma monitored by the M sensors.

In the above-described plasma processing apparatus, the M sensors are at least partially inserted into the microwave radiating mechanisms or inserted into the ceiling plate adjacent to the microwave radiating mechanisms.

In the above-described plasma processing apparatus, the sensor is coated with an insulating material.

In the above-described plasma processing apparatus, assuming that a height $Z_0$ of an inner surface of a ceiling plate of the processing container is 0, an electron temperature of the plasma measured by the sensor at the height $Z_0$ is $Te_0$, a distance from the inner surface of the ceiling plate to a workpiece is Z, and pressure in the processing container is p, the controller corrects the electron temperature $Te_0$ of the plasma measured by the sensor to an electron temperature $Te(Z)$ of the plasma on the workpiece based on the following Equation 1, and controls a distribution of the plasma based on the corrected electron temperature $Te(Z)$ of the plasma.

$$\begin{cases} Te(z) = Te_0 e^{-\alpha z} \\ \alpha(p) = -0.0181\ln(p[Torr]) + 0.1235 \end{cases} \quad (1)$$

In the above-described plasma processing apparatus, wherein assuming that a height $Z_0$ of an inner surface of a ceiling plate of the processing container is 0, electron density of the plasma measured by the sensor at the height $Z_0$ is $Ne_0$, a distance from the inner surface of the ceiling plate to a workpiece is Z, and pressure in the processing container is p, the controller corrects the electron density $Ne_0$ of the plasma measured by the sensor to electron density $Ne(Z)$ of the plasma on the workpiece based on the following Equation 2, and controls a distribution of the plasma based on the corrected electron density $Ne(Z)$ of the plasma.

$$\begin{cases} Ne(z) = Ne_0(1 - e^{-\beta z})e^{-\varsigma z} \\ \beta(p) = 0.0056 e^{0.7982 p[Torr]} \\ \varsigma(p) = 0.0089\ln(p[Torr]) + 0.0612 \end{cases} \quad (2)$$

In the above-described plasma processing apparatus, based on the corrected electron temperatures $Te(Z)$ of M plasmas and the corrected electron densities $Ne(Z)$ of the M plasmas, the controller controls at least any one of power and a phase of the microwaves radiated to the N microwave radiating mechanisms.

According to one aspect, there is provided a control method of controlling plasma using a plasma processing apparatus including a microwave radiating mechanism configured to radiate microwaves output from a microwave output unit into a processing container. The microwave radiating mechanism includes: an antenna configured to radiate the microwaves; a dielectric member configured to transmit the microwaves radiated from the antenna, and form an electric field for generating surface wave plasma by the microwaves; a sensor provided in the microwave radiating mechanism or adjacent to the microwave radiating mechanism, and configured to monitor electron temperature of the generated plasma; and a controller configured to determine a plasma ignition state based on the electron temperature of the plasma monitored by the sensor. The control method includes: determining a plasma ignition state based on the electron temperature of the plasma monitored by the sensor.

According to one aspect, it is possible to monitor the plasma ignition states in the plurality of regions in the plasma generating space.

Hereinafter, an exemplary embodiment of the present disclosure will be described with reference to the drawings. Further, in the present specification and the drawings, substantially identical configurations are denoted by the same reference numerals, and a repeated description thereof will be omitted.

<Microwave Plasma Processing Apparatus>

FIG. 1 illustrates an example of a cross-sectional view of a microwave plasma processing apparatus 100 according to an exemplary embodiment of the present disclosure. The microwave plasma processing apparatus 100 has a chamber 1 which accommodates a wafer W. The microwave plasma processing apparatus 100 is an example of a plasma processing apparatus for performing a predetermined plasma process on a semiconductor wafer W (hereinafter, referred to as a "wafer W") by using surface wave plasma formed by microwaves on a surface at a side of the chamber 1. A deposition process or an etching process is performed as an example of the predetermined plasma process.

The chamber 1 is a substantially cylindrical processing container which is configured in a gastight manner and made of a metallic material such as aluminum or stainless steel, and the chamber 1 is grounded. A microwave plasma source 2 is provided to face the inside of the chamber 1 from openings 1a formed in an inner wall of a ceiling plate of the chamber 1. When the microwaves are introduced into the chamber 1 from the microwave plasma source 2 through the openings 1a, the surface wave plasma is formed in the chamber 1.

A placement table 11 on which the wafer W is placed is provided in the chamber 1. The placement table 11 is supported by a cylindrical support member 12 that stands vertically at a center of a bottom portion of the chamber 1 via an insulating member 12a. As an example, a material, which constitutes the placement table 11 and the support member 12, is metal such as aluminum of which the surface is subjected to an alumite treatment (anodic oxidizing treatment) or an insulating member (ceramics or the like) having therein a high-frequency electrode. The placement table 11 may be provided with an electrostatic chuck for electrostatically holding the wafer W, a temperature control mechanism, and a gas flow path for supplying heat transfer gas to a rear surface of the wafer W.

The placement table 11 is electrically connected to a high-frequency bias power source 14 through a matching device 13. Ions in the plasma are introduced to the wafer W side as high-frequency power is supplied to the placement table 11 from the high-frequency bias power source 14. Further, the high-frequency bias power source 14 may not be provided in accordance with characteristics of the plasma process.

A gas discharge pipe 15 is connected to the bottom portion of the chamber 1, and a gas discharge device 16, which includes a vacuum pump, is connected to the gas discharge pipe 15. When the gas discharge device 16 operates, gas in the chamber 1 is discharged such that pressure in the chamber 1 is decreased at a high speed to a predetermined degree of vacuum. A loading and unloading port 17 for loading and unloading the wafer W and a gate valve 18 for opening and closing the loading and unloading port 17 are provided at a sidewall of the chamber 1.

The microwave plasma source 2 has a microwave output unit 30, microwave transmitting units 40, and microwave radiating mechanisms 50. The microwave output unit 30 outputs and distributes the microwaves to a plurality of paths.

The microwave transmitting unit 40 transmits the microwaves output from the microwave output unit 30. Circumferential edge microwave introducing mechanisms 43a and a central microwave introducing mechanism 43b, which are provided in the microwave transmitting units 40, serve to introduce the microwaves output from amplifier units 42 to the microwave radiating mechanisms 50 and to match impedance.

The circumferential edge microwave introducing mechanisms 43a and the central microwave introducing mechanism 43b each have a cylindrical outer conductor 52 and a bar-shaped inner conductor 53 provided at a center of the cylindrical outer conductor 52, and the cylindrical outer conductor 52 and the bar-shaped inner conductor 53 are coaxially disposed. A microwave transmitting path 44, through which microwave power is supplied and the microwaves are transmitted toward the microwave radiating mechanism 50, is provided between the outer conductor 52 and the inner conductor 53.

The circumferential edge microwave introducing mechanisms 43a and the central microwave introducing mechanism 43b each have slugs 61, and an impedance adjusting member 140 positioned at a tip end portion of the slugs 61. As the slugs 61 are moved, the impedance of a load (plasma) in the chamber 1 are matched with characteristic impedance of microwave power of the microwave output unit 30. The impedance adjusting member 140 is made of a dielectric material such that the impedance of the microwave transmitting path 44 is adjusted in accordance with a relative dielectric constant of the impedance adjusting member 140.

The microwave radiating mechanism 50 is provided to be sealed in a gastight manner in a support ring 129 provided at an upper side of the chamber 1, and radiates microwaves, which are output from the microwave output unit 30 and transmitted from the microwave transmitting unit 40, into the chamber 1. The microwave radiating mechanisms 50 are provided in the ceiling plate of the chamber 1 and constitute a part of a ceiling portion.

The microwave radiating mechanisms 50 have a main body portion 120, slow-wave members 121 and 131, microwave transmitting members 122 and 132, slots 123 and 133, and dielectric layers 124. The main body portion 120 is made of metal.

Figure 2:
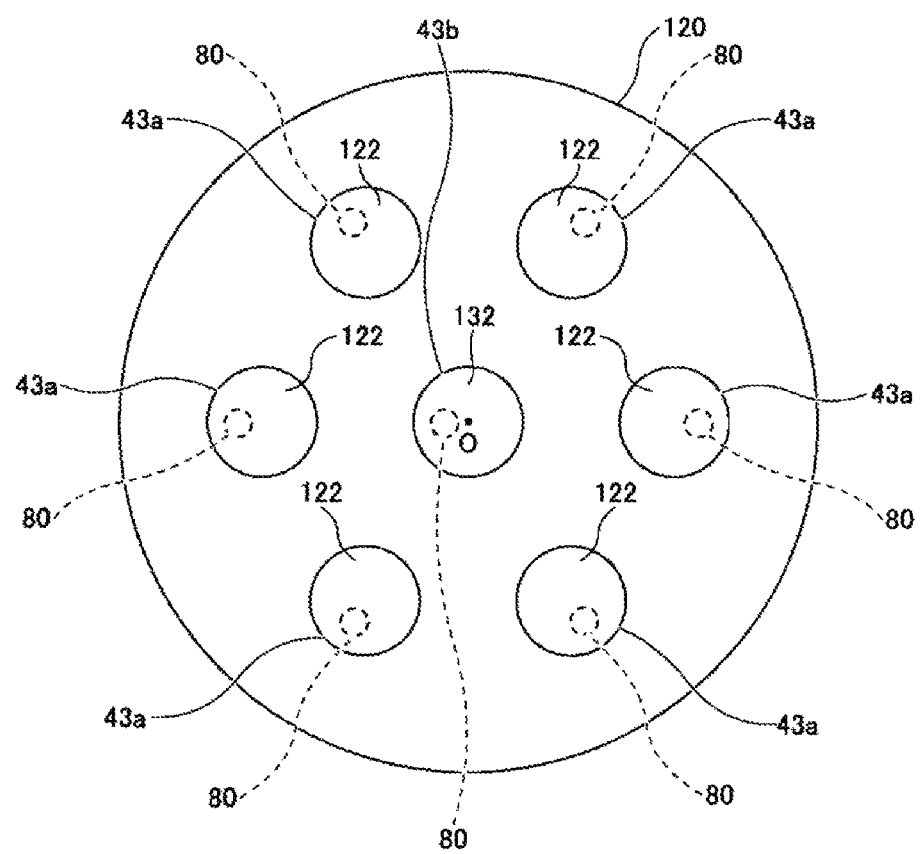
FIG. 2 is a view illustrating an example of an inner wall of a ceiling plate of the microwave plasma processing apparatus according to the exemplary embodiment.

The main body portion 120 is connected to the six circumferential edge microwave introducing mechanisms 43a and the single central microwave introducing mechanism 43b. FIG. 2 illustrates an example of an inner wall of the ceiling plate of the microwave plasma processing apparatus 100 according to the exemplary embodiment. Gas supply holes are omitted from FIG. 2. As illustrated in FIG. 2, the six circumferential edge microwave introducing mechanisms 43a are disposed at equal intervals in a circumferential direction outside the ceiling plate (main body portion 120) of the chamber 1. The single central microwave introducing mechanism 43b is disposed at a center of the ceiling plate of the chamber 1.

Referring back to FIG. 1, the slow-wave member 121 is fitted into the main body portion 120 in a state in which the slow-wave member 121 is connected to the circumferential edge microwave introducing mechanism 43a. The slow-wave member 131 is fitted into the main body portion 120 in a state in which the slow-wave member 131 is connected to the central microwave introducing mechanism 43b. The slow-wave members 121 and 131 are formed as disk-shaped dielectric members that transmit the microwaves. The slow-wave members 121 and 131 have relative dielectric constants higher than that of the vacuum, and for example, may be made of ceramics such as quartz or alumina ($Al_2O_3$), fluorine-based resin such as polytetrafluoroethylene, or polyimide-based resin. Because the wavelength of the microwave is increased in vacuum, the slow-wave members 121 and 131 are made of a material having a relative dielectric constant higher than that of the vacuum, and as a result, the slow-wave members 121 and 131 serve to decrease the size of an antenna including the slots 123 and 133 by decreasing the wavelength of the microwave.

Below the slow-wave members 121 and 131, the disk-shaped microwave transmitting members 122 and 132 are fitted into the main body portion 120. The slot 123 and the dielectric layer 124 are formed between the slow-wave member 121 and the microwave transmitting member 122 such that the slow-wave member 121, the slot 123, the dielectric layer 124, and the microwave transmitting member 122 are formed in this order from the upper side thereof. The slot 123 is formed in the main body portion 120 between the slow-wave member 131 and the microwave transmitting member 132.

The microwave transmitting members 122 and 132 are made of a dielectric material that transmits microwaves.

As illustrated in FIG. 2, in the present exemplary embodiment, six microwave transmitting members 122, which correspond to six circumferential edge microwave introducing mechanisms 43a, are disposed at equal intervals in the circumferential direction of the main body portion 120, and exposed in a circular shape to the inside of the chamber 1. In addition, a single microwave transmitting member 132, which corresponds to the central microwave introducing mechanism 43b, is exposed in a circular shape toward the inside of the chamber 1 at the center of the chamber 1.

The microwave transmitting members 122 and 132 serve as dielectric windows for forming surface wave plasma uniform in the circumferential direction. For example, similar to the slow-wave members 121 and 131, the microwave transmitting members 122 and 132 may be made of ceramics such as quartz or alumina ($Al_2O_3$), fluorine-based resin such as polytetrafluoroethylene, or polyimide-based resin.

In the present exemplary embodiment, the number of circumferential edge microwave introducing mechanisms 43a is six, but the number of circumferential edge microwave introducing mechanisms 43a is not limited thereto, and N circumferential edge microwave introducing mechanisms 43a are disposed. N may be two or more, and may particularly be three or more, and for example, N may be three to six.

Referring back to FIG. 1, the microwave radiating mechanisms 50 are provided with first gas introducing units 21 having a shower structure, and a first gas supply source 22 is connected to the first gas introducing units 21 through gas supply pipes 111. A first gas, which is supplied from the first gas supply source 22, is supplied in the form of a shower into the chamber 1 through the first gas introducing units 21. The first gas introducing unit 21 is an example of a first gas shower head which supplies the first gas at a first height from a plurality of gas holes formed in the ceiling portion of the chamber 1. Examples of the first gas may include, for example, a gas such as Ar gas for generating plasma, or for example, a gas such as $O_2$ gas or $N_2$ gas to be decomposed by high energy.

Gas supply nozzles 27, which are an example of second gas introducing units, are provided in the chamber 1 at positions in the chamber 1 between the placement table 11 and the microwave radiating mechanisms 50. The gas supply nozzles 27 protrude horizontally toward the inside of the chamber 1 from the sidewall of the chamber 1. The gas supply nozzles 27 are connected to gas supply pipes 28a in the sidewall of the chamber 1, and a second gas supply source 29 is connected to the gas supply pipes 28a.

A second gas such as, for example, $SiH_4$ gas or $C_5F_8$ gas, which is a process gas to be supplied without being maximally decomposed, is supplied from the second gas supply source 29 during the plasma process such as the deposition process or the etching process. The gas supply nozzles 27 supply the second gas from a plurality of gas holes at a height lower than the height of the plurality of gas holes through which the first gas is supplied from the first gas supply source 22. Further, various types of gases may be used as the gases to be supplied from the first gas supply source 22 and the second gas supply source 29 in accordance with the contents of the plasma process.

Respective parts of the microwave plasma processing apparatus 100 are controlled by a control device 3. The control device 3 has a microprocessor 4, a read only memory (ROM) 5, and a random access memory (RAM) 6. The ROM 5 or the RAM 6 stores a process sequence of the microwave plasma processing apparatus 100 and a process recipe which is a control parameter. The microprocessor 4 is an example of a controller which controls the respective parts of the microwave plasma processing apparatus 100 based on the process sequence and the process recipe. In addition, the control device 3 has a touch panel 7 and a display 8, and may display an input or a result when performing predetermined control according to the process sequence and the process recipe.

When the microwave plasma processing apparatus 100 having such a configuration performs the plasma process, the wafer W is first loaded into the chamber 1 through the loading and unloading port 17 from the opened gate valve 18 in a state in which the wafer W is held on a transfer arm. The gate valve 18 is closed after the wafer W is loaded. When the wafer W is transferred to a position above the placement table 11, the wafer W is transferred from the transfer arm to pusher pins and placed on the placement table 11 as the pusher pins move downward. The pressure in the chamber 1 is maintained to a predetermined degree of vacuum by the gas discharge device 16. The first gas is introduced in the form of a shower into the chamber 1 from the first gas introducing units 21, and the second gas is introduced in the form of a shower into the chamber 1 from the gas supply nozzle 27. The microwaves are radiated from the microwave radiating mechanisms 50 provided below the six circumferential edge microwave introducing mechanisms 43a and the central microwave introducing mechanism 43b through the circumferential edge microwave introducing mechanisms 43a and the central microwave introducing mechanism 43b. Therefore, the first and second gases are decomposed, and the plasma process is performed on the wafer W by the surface wave plasma generated on the surface of the chamber 1.

<Microwave Plasma Source>

Figure 3:
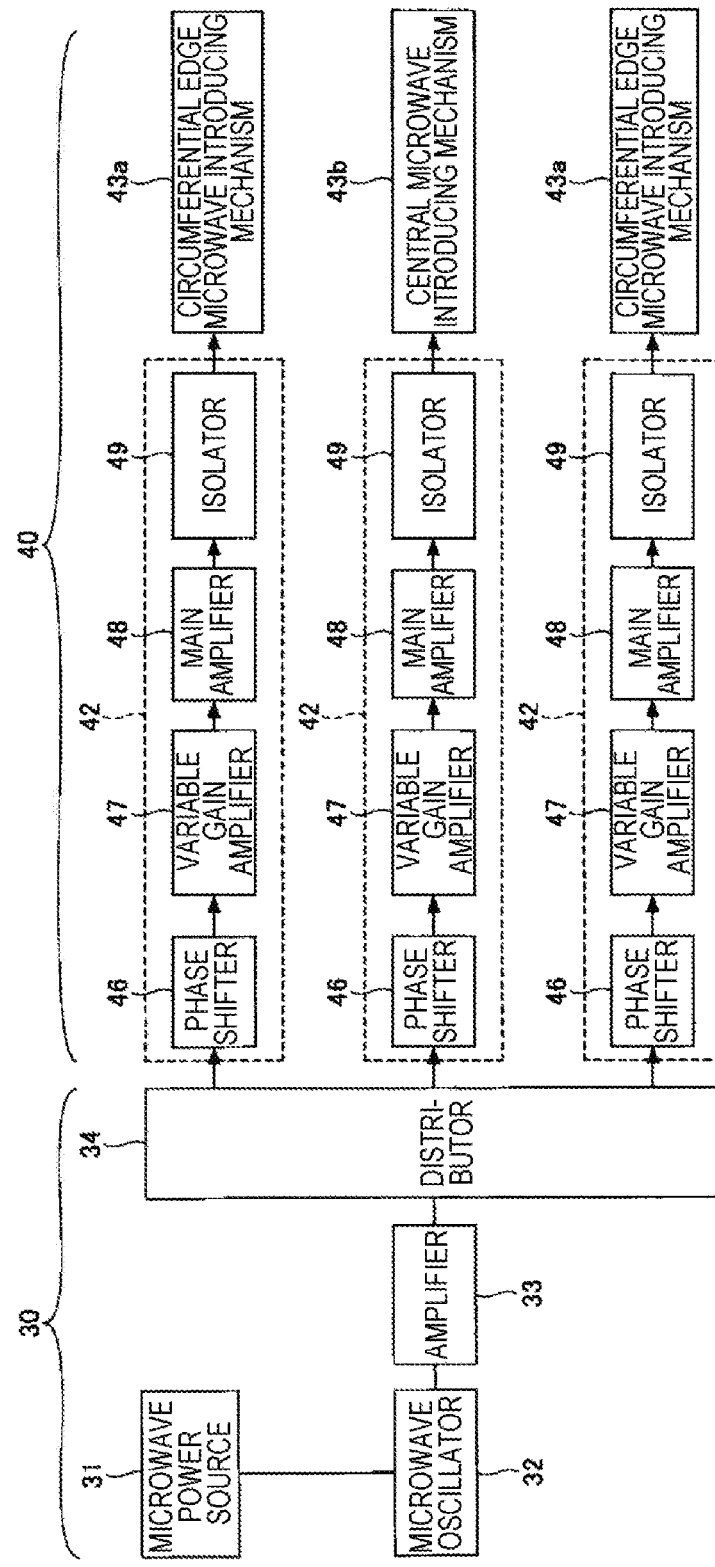
FIG. 3 is a view illustrating an example of a configuration of a microwave plasma source according to the exemplary embodiment.

As illustrated in FIG. 3, the microwave output unit 30 of the microwave plasma source 2 has a microwave power source 31, a microwave oscillator 32, an amplifier 33 which amplifies the generated microwaves, and a distributor 34 which distributes a plurality of amplified microwaves.

The microwave oscillator 32 generates microwaves having a predetermined frequency through, for example, a phase locked loop (PLL). The distributor 34 distributes the microwaves amplified by the amplifier 33 while matching impedance at an input side and impedance at an output side so as to maximally inhibit a loss of microwave. Further, various types of frequencies ranging from 700 MHz to 3 GHz may be used as the frequency of the microwave.

The microwave transmitting unit 40 has the plurality of amplifier units 42, and the circumferential edge microwave introducing mechanisms 43a and the central microwave introducing mechanism 43b which are provided to correspond to the amplifier units 42. The amplifier units 42 guide the microwaves, which are distributed by the distributor 34, to the circumferential edge microwave introducing mechanisms 43a and the central microwave introducing mechanism 43b. The amplifier unit 42 has a phase shifter 46, a variable gain amplifier 47, a main amplifier 48 which constitutes a solid state amplifier, and an isolator 49.

The phase shifter 46 may modulate radiation characteristics by changing phases of the microwaves. For example, it is possible to change a plasma distribution by controlling directivity by adjusting the phases of the microwaves introduced to the circumferential edge microwave introducing mechanisms 43a and the central microwave introducing mechanism 43b. In addition, it is possible to obtain circularly polarized waves by shifting the phases of the adjacent microwave introducing mechanisms by 90°. In addition, the phase shifter 46 may be used for the purpose of space synthesis in a tuner by adjusting delay characteristics between components in the amplifier. However, the phase shifter 46 may not be provided unless the radiation characteristics or adjust delay characteristics between the components in the amplifier need to be modulated.

The variable gain amplifier 47 adjusts plasma intensity by adjusting a power level of the microwave input to the main amplifier 48. The variable gain amplifier 47 is changed for each antenna module, thereby producing a distribution of the generated plasma.

For example, the main amplifier 48, which constitutes a solid state amplifier, has an input matching circuit, a semiconductor amplifier element, an output matching circuit, and a high-Q resonance circuit. The isolator 49 is configured to separate reflective microwaves which are reflected by a slot antenna unit and directed toward the main amplifier 48, and the isolator 49 has a circulator and a dummy load (coaxial terminator). The circulator guides the reflected microwaves to the dummy load, and the dummy load converts the reflective microwaves, which are guided by the circulator, into heat. The circumferential edge microwave introducing mechanisms 43a and the central microwave introducing mechanism 43b introduce the microwaves output from the amplifier units 42 to the microwave radiating mechanisms 50.

<Probe>

As illustrated in FIG. 1, in the microwave plasma processing apparatus 100 according to the present exemplary embodiment, probes 80 are provided in the microwave radiating mechanisms 50. The number of probes 80 is seven or a multiple of seven to correspond to the seven microwave radiating mechanisms 50 (including the microwave transmitting members 122 and 132). The numbers of probes 80, which are provided in the microwave radiating mechanisms 50, respectively, are equal to one another. In the present exemplary embodiment, the seven probes 80 are disposed in the seven microwave radiating mechanisms 50, respectively, one for each of the microwave radiating mechanisms 50.

However, the number of probes 80 is not limited thereto, and the probes 80 of which the number is N or a multiple of N may be disposed when the number of microwave radiating mechanisms 50 is N. Each of the probes 80 of which the number is N or a multiple of N is disposed at a position at an equal distance from a center of each of the microwave transmitting members 122 and 132 of which the number is N. In addition, each of the probes 80 is disposed perpendicular to the chamber 1.

At least a part of the probe 80 is inserted into the microwave radiating mechanism 50, and a tip end of the probe 80 is not exposed to the chamber 1. However, the tip end of the probe 80 may be exposed to the chamber 1. However, the tip end of the probe 80 does not protrude to the inside of the chamber 1. In addition, the reason why at least a part of the probe 80 needs to be inserted into the microwave radiating mechanism 50 is that a distribution of plasma may not be precisely detected in the state in which the probe 80 is in contact with an outer surface of the ceiling plate of the chamber 1.

Each of the probes 80 monitors an electron temperature Te of the surface wave plasma, and determines a plasma ignition state based on the measured electron temperature Te of the surface wave plasma.

However, the distribution of plasma may not be monitored only based on the electron temperature Te of the surface wave plasma. Therefore, in the present exemplary embodiment, both the electron density Ne of the plasma and the electron temperature Te of the plasma are monitored by using the probes 80 such that the distribution of the plasma is controlled based on the measured electron temperature Te and the measured electron density Ne of the surface wave plasma.

For example, the probe 80 may have a metallic part coated with an insulating material such as alumina ($Al_2O_3$). Therefore, it is possible to avoid the occurrence of metal contamination caused by the probes 80 in the chamber 1 during the plasma process, thereby inhibiting the occurrence of particles.

When a sine wave voltage is applied to the probe 80 under the control of the control device 3, a measuring device 81 measures an electric current flowing through the probe 80 during the plasma process. The electric current flowing through the probe 80 is equivalent to an electric current flowing through the surface wave plasma generated in the chamber 1. The measuring device 81 transmits a signal, which indicates a waveform of the measured electric current, to the control device 3. The microprocessor 4 of the control device 3, which has received the signal, analyzes the waveform of the electric current included in the signal by transforming the waveform of the electric current through Fourier transform, thereby calculating the electron density Ne and the electron temperature Te of the surface wave plasma. Therefore, as illustrated in FIG. 2, the distribution of the plasma below the microwave transmitting members 122 and 132 may be monitored by the seven probes 80.

In the case of the surface wave plasma, the electron temperature Te of the plasma on the inner surface of the ceiling plate is increased. Therefore, in the present exemplary embodiment, the probes 80 are exposed to the inner surface of the ceiling plate of the chamber 1, or the probes 80 are inserted, to be adjacent to the inner surface of the ceiling plate, into holes formed in the microwave transmitting members 122 and 132. Therefore, the electron temperature Te of the plasma on the inner surface of the ceiling plate may be precisely measured.

Based on the measurement result, the microprocessor 4 of the control device 3 determines whether a plasma ignition state is made by the surface wave plasma formed on the surface of the microwave transmitting member 122 of each of the seven microwave radiating mechanisms 50, which are exposed to the chamber 1, and the surface wave plasma formed adjacent to the surface. For example, the microprocessor 4 determines that the plasma ignition state is made when the measured electron temperature Te of the plasma is higher than a predetermined threshold value.

Figure 4:
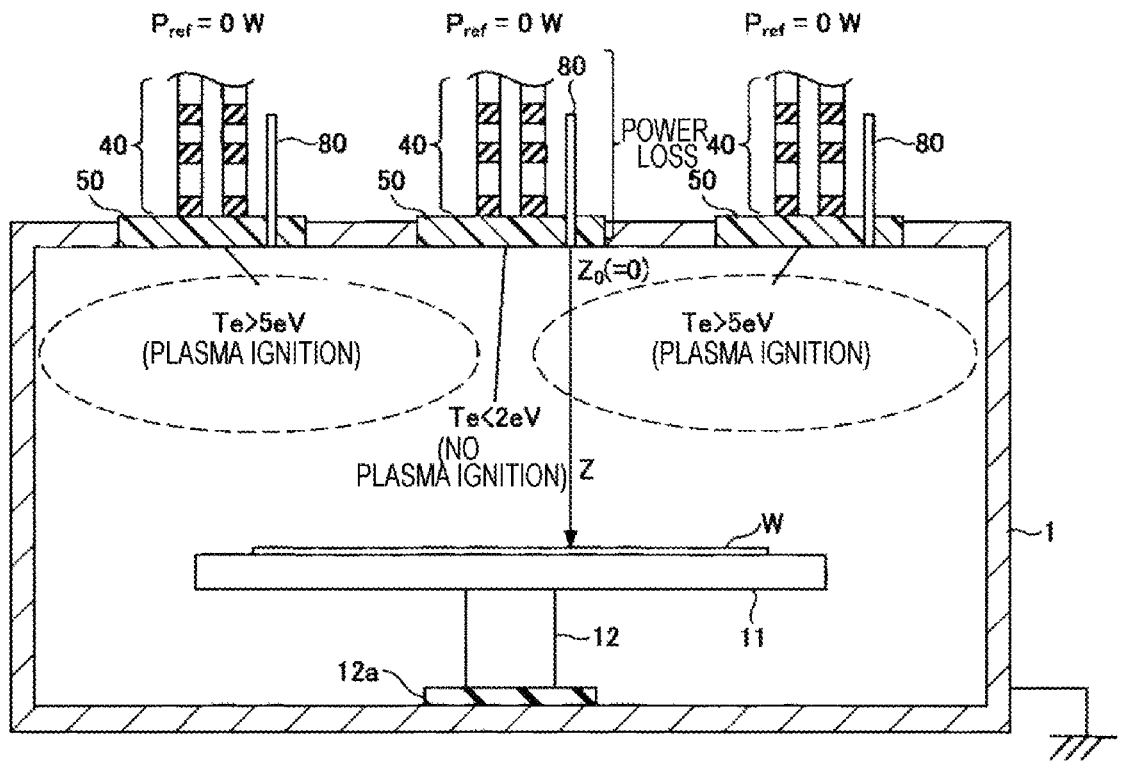
FIG. 4 is a view for explaining determination of plasma ignition measured by probes according to the exemplary embodiment.

Accordingly, as illustrated in FIG. 4, the determination of the plasma ignition is performed in respect to different regions in a plasma processing space below the respective microwave radiating mechanisms 50. In an example of FIG. 4, the monitored electron temperature Te of the plasma is consequently higher than 5 eV in regions below the microwave radiating mechanisms 50 at the left and right sides. In this case, the microprocessor 4 determines that the plasma ignition state is made in the regions below the microwave radiating mechanisms 50 at the left and right sides.

The monitored electron temperature Te of the plasma is consequently lower than 2 eV in the region below the microwave radiating mechanism 50 at the center. In this case, the microprocessor 4 determines that the plasma ignition state is not made in the region below the microwave radiating mechanism 50 at the center. Further, the microprocessor 4 is an example of a controller which determines the plasma ignition state based on the electron temperature Te of the plasma monitored by the probe 80 as an example of a sensor. Further, FIG. 4 briefly illustrates a configuration of the respective microwave radiating mechanisms 50.

<Electron Temperature Te(Z) and Electron Density Ne(Z)>

The microprocessor 4 according to the present exemplary embodiment calculates the electron temperature of the plasma at a height of the wafer W from the electron temperature of the plasma monitored using the probe 80.

As illustrated in FIG. 4, it is assumed that the height $Z_0$ of the inner surface of the ceiling plate of the chamber 1 is 0 mm, and the distance from the inner surface of the ceiling plate to the wafer W is Z. Assuming that the electron temperature of the plasma measured by the probe 80 at the height $Z_0$ is $Te_0$ and the pressure in the chamber 1 is p, the microprocessor 4 corrects the electron temperature $Te_0$ of the plasma measured by the probe 80 at the height $Z_0$ to an electron temperature Te(Z) of the plasma on the wafer W based on the following Equation 1.

$$\begin{cases} Te(z) = Te_0 e^{-\alpha z} \\ \alpha(p) = -0.018\ln(p[Torr]) + 0.1235 \end{cases} \quad \text{[Equation 1]}$$

Assuming that the electron density of the plasma measured by the probe 80 at the height $Z_0$ is $Ne_0$ and pressure in the chamber 1 is p, the microprocessor 4 corrects the electron density $Ne_0$ of the plasma measured by the probe 80 at the height $Z_0$ to electron density Ne(Z) of the plasma on the wafer W based on the following Equation 2.

$$\begin{cases} Ne(z) = Ne_0(1 - e^{-\beta z})e^{-\varsigma z} \\ \beta(p) = 0.0056 e^{0.7982 p[Torr]} \\ \varsigma(p) = 0.0089\ln(p[Torr]) + 0.0612 \end{cases} \quad \text{[Equation 2]}$$

The microprocessor 4 controls the distribution of the plasma based on the electron temperature Te(Z) and the electron density Ne(Z) after the correction. Specifically, the microprocessor 4 determines the distributed state of the plasma in the vicinity of the wafer W in the regions below the seven microwave radiating mechanisms 50 based on the seven electron temperatures Te(Z) of the plasma and the seven electron densities Ne(Z) of the plasma at the positions at a distance Z from the ceiling plate.

Based on the result of determining the distributed state of the plasma, the microprocessor 4 controls, in real time during the plasma process, at least any one of power of the microwaves transmitted through the seven microwave transmitting paths 40 and phases of the microwaves transmitted through the seven microwave transmitting paths 40.

Specifically, according to the electron temperature Te(Z) and the electron density Ne(Z) after the correction, the microprocessor 4 controls the variable gain amplifier 47 of the amplifier unit 42 which outputs microwaves to the corresponding microwave introducing mechanism 43. Therefore, the microprocessor 4 adjusts the power level of the microwaves input to the main amplifier 48. In this way, the microprocessor 4 may change the state of the plasma in the vicinity of the wafer W by adjusting plasma intensity of the microwaves introduced into the corresponding microwave introducing mechanism 43.

According to the electron temperature Te(Z) and the electron density Ne(Z) after the correction, the microprocessor 4 controls the phase shifter 46 of the amplifier unit 42 which outputs microwaves to the corresponding microwave introducing mechanism 43. Therefore, the microprocessor 4 modulates radiation characteristics of the microwaves. In this way, the microprocessor 4 may change the state of the plasma in the vicinity of the wafer W by controlling the directivity of the microwaves by adjusting the phases of the microwaves introduced into the corresponding microwave introducing mechanism 43.

As described above, in the present exemplary embodiment, the power of the microwave and the phase of the microwave are controlled, but at least any one of the power of the microwave and the phase of the microwave may be controlled. However, both the power of the microwave and the phase of the microwave may be controlled.

Figure 5:
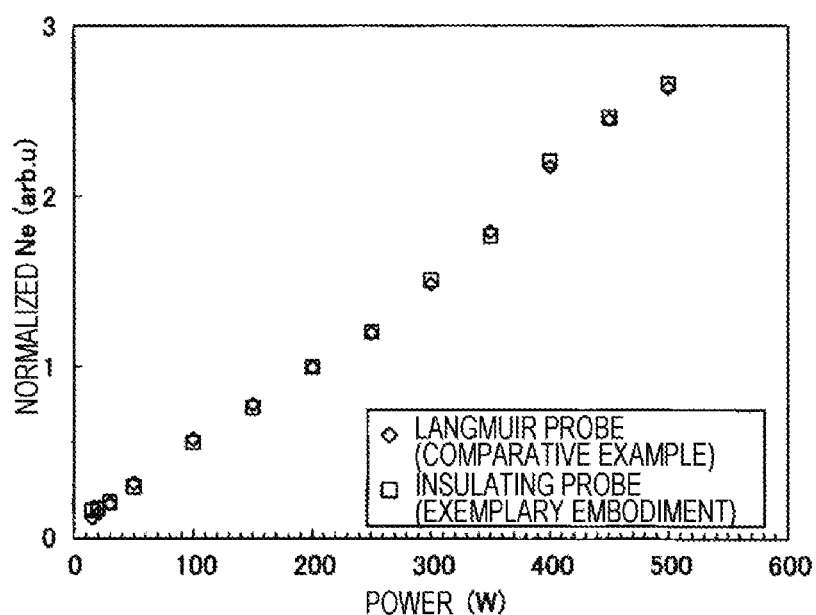
FIG. 5 is a view illustrating an example of power dependency of electron density of plasma measured by the probes according to the exemplary embodiment.

A graph of FIG. 5 illustrates an example of a result of comparing power dependency of electron density Ne of plasma measured by the probe 80 according to the present exemplary embodiment with power dependency of electron density Ne measured by a Langmuir probe of a comparative example. According to the present graph, it can be seen that the power dependency of the electron density Ne of the plasma measured by the probe 80 according to the present exemplary embodiment substantially coincides with the power dependency of the electron density Ne of the plasma measured by the Langmuir probe.

Figure 6:
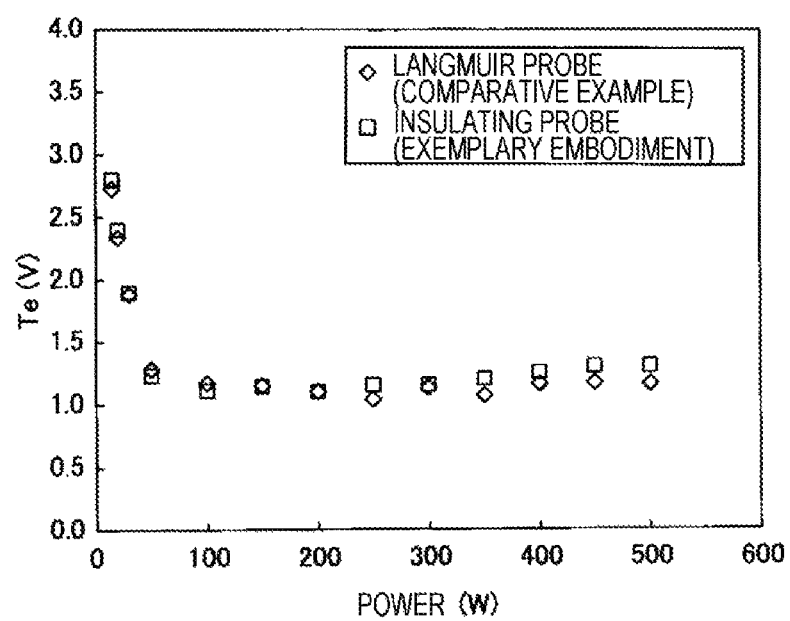
FIG. 6 is a view illustrating an example of power dependency of an electron temperature of the plasma measured by the probes according to the exemplary embodiment.

The graph of FIG. 6 illustrates an example of a result of comparing power dependency of electron temperature Te of plasma measured by the probe 80 according to the present exemplary embodiment with the power dependency of electron temperature Te measured by the Langmuir probe of the comparative example. According to the present graph, it can be seen that the power dependency of the electron temperature Te of the plasma measured by the probe 80 according to the present exemplary embodiment almost coincides with the power dependency of the electron temperature Te of the plasma measured by the Langmuir probe.

That is, the result of measuring electrical characteristics of plasma illustrates that the probe 80 according to the present exemplary embodiment and the Langmuir probe have almost the same characteristics, and as a result, it can be confirmed that the probe 8 according to the present exemplary embodiment performs almost the same function as the Langmuir probe. Further, an example of measuring electrical characteristics of plasma by using the Langmuir probe is disclosed in Japanese Patent Application Laid-Open No. 2009-194032.

As described above, according to the plasma processing apparatus according to the present exemplary embodiment, the plasma may be electrically measured by the seven probes 80 provided to correspond to the seven microwave radiating mechanisms 50. Therefore, based on the measurement result, it is possible to monitor the plasma ignition states in the corresponding seven regions in the plasma generating space. In addition, the measurement result is corrected by using Equations 1 and 2, and as a result, it is possible to monitor the distribution of the plasma and the characteristics of the plasma in respect to the corresponding seven regions on the wafer W. Therefore, it is possible to control the distribution of the plasma and uniformity of the plasma, and as a result, it is possible to reduce time and costs required to optimize the process.

<Mounting Position of Probe>

Figure 7A:
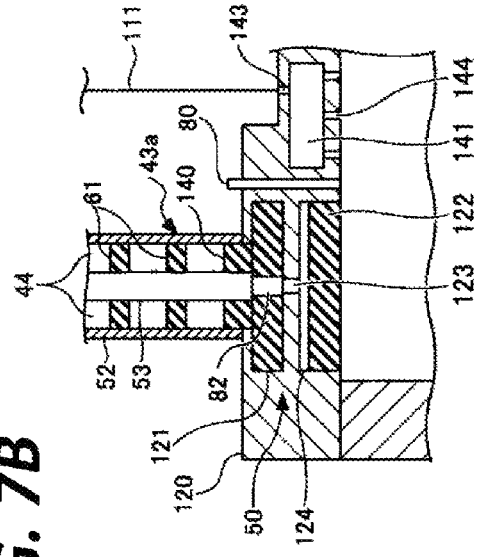
FIGS. 7A to 7D are views illustrating examples of mounting positions of the probe according to the exemplary embodiment.

Next, a mounting position of a probe 80 will be described with reference to FIGS. 7A to 7D. The probe 80 illustrated in FIG. 7A penetrates the slow-wave member 121 and the microwave transmitting member 122 of the microwave radiating mechanism 50, and the tip end of the probe 80 is exposed to the chamber 1 from the microwave transmitting member 122. In FIG. 7A, the probes 80 are disposed in the microwave radiating mechanisms 50, respectively, one for each of the microwave radiating mechanisms 50.

Figure 7C:
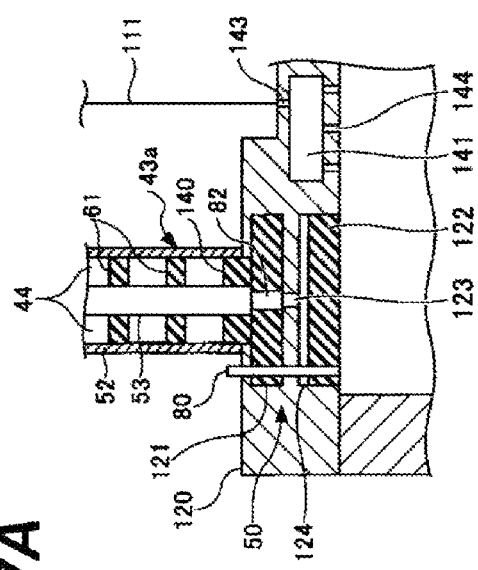
Figure 7B:
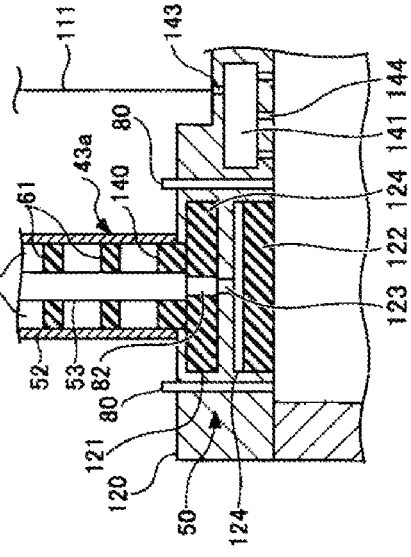

The probe 80 illustrated in FIG. 7B penetrates the ceiling plate (main body portion 120) adjacent to the microwave radiating mechanism 50, and the tip end of the probe 80 is exposed to the chamber 1 from the microwave transmitting member 122. In FIG. 7B, the probes 80 are disposed in the vicinity of the microwave radiating mechanisms 50, respectively, one for each of the microwave radiating mechanisms 50.

The two probes 80 illustrated in FIG. 7C penetrate the inside of the microwave radiating mechanism 50, and the tip ends of the probes 80 are exposed to the chamber 1 from the microwave transmitting member 122. In FIG. 7C, the probes 80 are disposed in the microwave radiating mechanisms 50, two for each of the microwave radiating mechanisms 50.

Figure 7D:
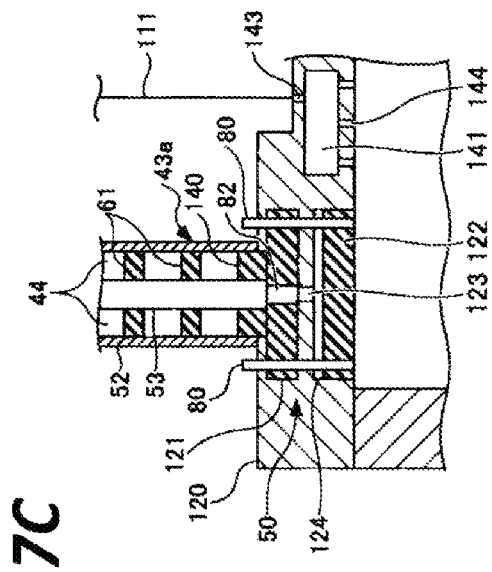

The two probes 80 illustrated in FIG. 7D penetrate the ceiling plate adjacent to the microwave radiating mechanism 50, and the tip ends of the probes 80 are exposed to the chamber 1 from the microwave transmitting member 122. In FIG. 7D, the probes 80 are disposed adjacent the microwave radiating mechanisms 50, two for each of the microwave radiating mechanisms 50.

The mounting positions of the probe 80 illustrated in FIGS. 7A to 7D are examples, and a single probe 80 or a plurality of probes 80 may be disposed in or adjacent to the microwave radiating mechanism 50. The numbers of probes 80, which are provided in respective microwave radiating mechanisms 50, may be equal to each other, but the numbers of probes 80 may be different from each other.

<Determination of Plasma Ignition>

Figure 8:
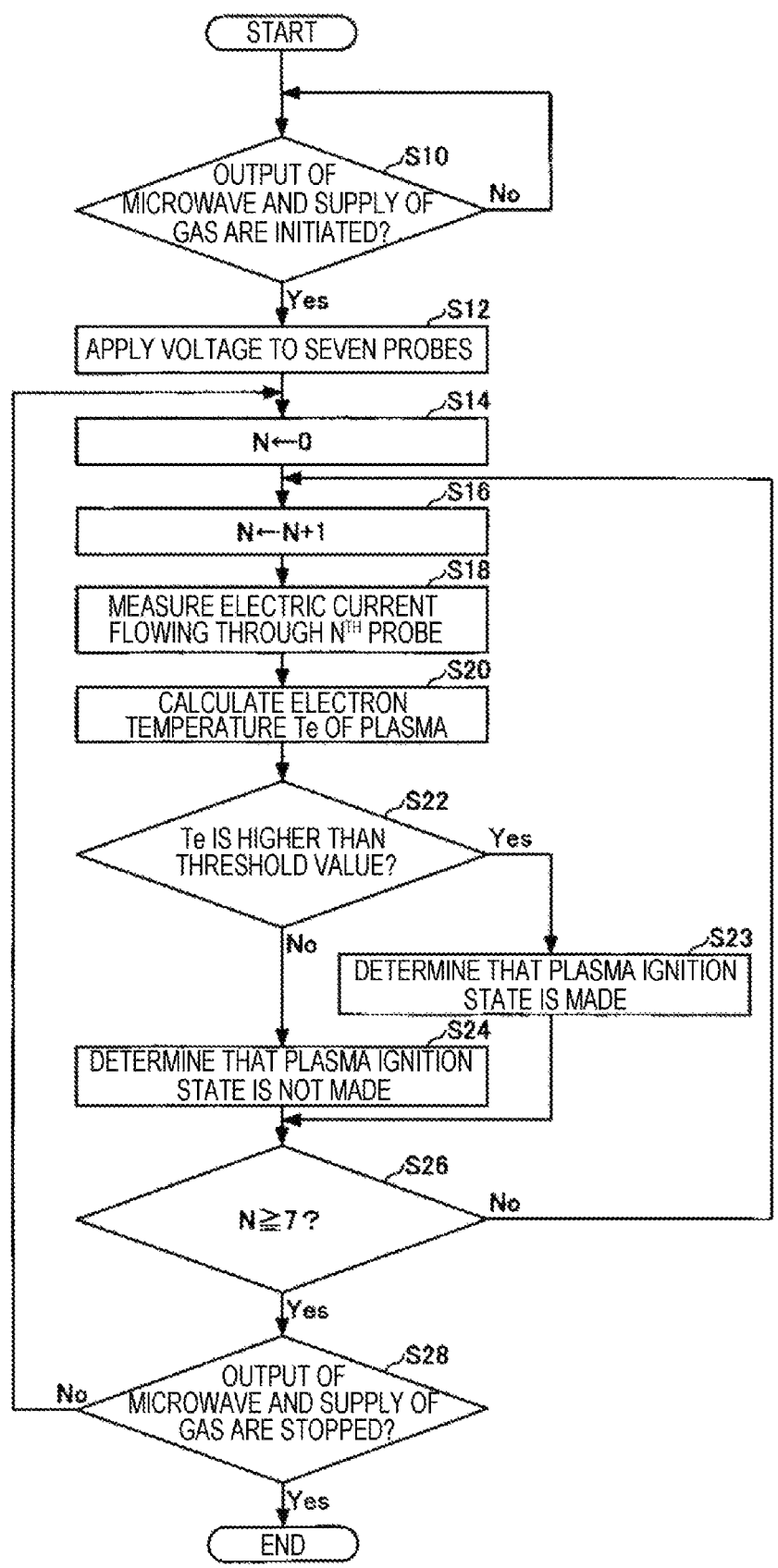
FIG. 8 is a flowchart illustrating an example of a process of determining plasma ignition in accordance with a measurement result by the probe according to the exemplary embodiment.

Next, an example of a process of determining plasma ignition in accordance with the measurement result by the probe 80 according to the present exemplary embodiment will be described with reference to a flowchart of FIG. 8. The present process is performed by the microprocessor 4 of the control device 3.

When the present process is initiated, the microprocessor 4 determines whether an output of microwaves and a supply of gas are initiated (step S10).

When the microprocessor 4 determines that the output of the microwaves and the supply of the gas are initiated, the microprocessor 4 applies voltage to the seven probes 80 which are provided in the seven microwave radiating mechanisms 50, respectively (step S12). Next, the microprocessor 4 sets a variable N to "0" (step S14).

Next, the microprocessor 4 adds "1" to the variable N (step S16). The measuring device 81 measures an electric current flowing through the $N^{th}$ probe 80, and transmits a signal indicating the measurement result to the control device 3 (step S18).

The microprocessor 4 receives the signal from the measuring device 81, and acquires a waveform of the electric current indicated by the signal. The microprocessor 4 calculates the electron temperature Te of the surface wave plasma by analyzing the acquired waveform of the electric current by transforming the acquired waveform of the electric current through Fourier transform (step S20). Therefore, it is possible to monitor the plasma ignition state in the region below one microwave radiating mechanism 50 which is measured by one probe 80 used among the probes 80 provided in the seven microwave radiating mechanisms 50.

Next, the microprocessor 4 determines whether the electron temperature Te of the surface wave plasma is higher than a predetermined threshold value (step S22). When the microprocessor 4 determines that the electron temperature Te of the surface wave plasma is higher than the predetermined threshold value, the microprocessor 4 determines that the plasma ignition state is made (step S23), and the process goes to step S26.

Meanwhile, when the microprocessor 4 determines that the electron temperature Te of the surface wave plasma is equal to or lower than the predetermined threshold value, the microprocessor 4 determines that the plasma ignition state is not made (step S24), and the process goes to step S26.

Next, the microprocessor 4 determines whether the variable N is seven or more (step S26). When the variable N is less than seven, the microprocessor 4 determines that the measurement by all of the probes 80 is not completed, and the process goes back to step S16, and steps S16 to S24 are repeated. Meanwhile, when the variable N is seven or more, the microprocessor 4 determines that the measurement by all of the probes 80 is completed, and determines whether the output of the microwave and the supply of the gas are stopped (step S28). When the microprocessor 4 determines that the output of the microwave and the supply of the gas are not stopped, the process goes back to step S14, the variable N is initialized (step S14), and the subsequent processes are repeated. Meanwhile, when the microprocessor 4 determines that the output of the microwave and the supply of the gas are stopped, the present process ends.

<Plasma Distribution Control>

Figure 9:
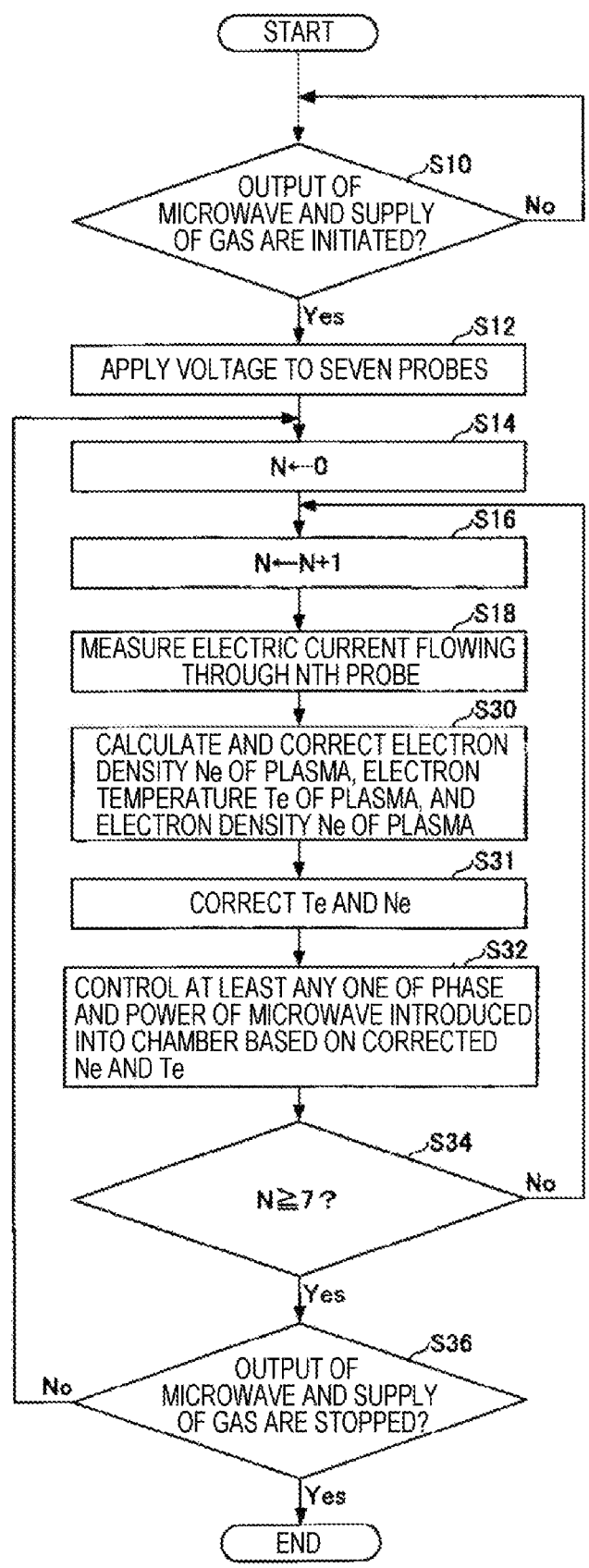
FIG. 9 is a flowchart illustrating an example of a process of controlling a distribution of plasma in accordance with a measurement result by the probe according to the exemplary embodiment.

Finally, an example of a process of controlling a distribution of plasma in accordance with the measurement result by the probe 80 according to the present exemplary embodiment will be described with reference to a flowchart of FIG. 9. The present process is performed by the microprocessor 4 of the control device 3.

When the present process is initiated, the microprocessor 4 determines whether an output of microwaves and a supply of gas are initiated (step S10).

When the microprocessor 4 determines that the output of the microwaves and the supply of the gas are initiated, the microprocessor 4 applies voltage to the seven probes 80 (step S12). Next, the microprocessor 4 sets a variable N to "0" (step S14).

Next, the microprocessor 4 adds "1" to the variable N (step S16). The measuring device 81 measures an electric current flowing through the $N^{th}$ probe 80, and transmits a signal indicating the measurement result to the control device 3 (step S18).

The microprocessor 4 receives the signal from the measuring device 81, and acquires a waveform of the electric current indicated by the signal. The microprocessor 4 calculates the electron density Ne of the plasma and the electron temperature Te of the plasma by analyzing the acquired waveform of the electric current by transforming the acquired waveform of the electric current through Fourier transform (step S30).

Next, the microprocessor 4 sets the calculated electron temperature Te of the plasma to the electron temperature $Te_0$ when Z is 0, and corrects the electron temperature $Te_0$ to the electron temperature Te(Z) of the plasma on the wafer W based on Equation 1 (step S31). In addition, the microprocessor 4 sets the calculated electron density Ne of the plasma to the electron density $Ne_0$ when Z is 0, and corrects the electron density $Ne_0$ to the electron density Ne(Z) of the plasma on the wafer W based on Equation 2 (step S31).

Next, based on the corrected electron temperature Te(Z) and the corrected electron density Ne(Z), the microprocessor 4 controls, in real time, the power of the microwaves by controlling the corresponding variable gain amplifier 47 (step S32). In addition, the microprocessor 4 controls, in real time, the phases of the microwaves by controlling the corresponding phase shifter 46 (step S32).

Next, the microprocessor 4 determines whether the variable N is seven or more (step S34). When the variable N is less than seven, the microprocessor 4 determines that the measurement by all of the probes 80 is not completed, and the process goes back to step S16, and the processes subsequent to step 16 are repeated. Meanwhile, when the variable N is seven or more, the microprocessor 4 determines that the measurement by all of the probes 80 is completed, and determines whether the output of the microwave and the supply of the gas are stopped (step S36). When the microprocessor 4 determines that the output of the microwave and the supply of the gas are not stopped, the process goes back to step S14, the variable N is initialized (step S14), and the subsequent processes are repeated. Meanwhile, when the microprocessor 4 determines that the output of the microwave and the supply of the gas are stopped, the present process ends.

As described above, according to the microwave plasma processing apparatus 100 of the present exemplary embodiment, it is possible to monitor the plasma ignition state in each of the predetermined regions below the microwave radiating mechanisms 50 by using the probes 80. In addition, it is possible to control the distribution of the plasma and the characteristics of the plasma.

According to the microwave plasma processing apparatus according to the present disclosure, it is possible to ascertain an energy distribution of kinetic energy of electrons by using an electric energy distribution function (EEDF).

In the present specification, the semiconductor wafer W has been described as an example of a workpiece. However, the workpiece is not limited thereto, and various types of substrates may be used for a liquid crystal display (LCD) or a flat panel display (FPD), a photo mask, a CD substrate, a printed substrate, and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a microwave transmitter configured to radiate microwaves output from a microwave power source into a processing container, wherein the microwave transmitter includes:
      an antenna configured to radiate the microwaves;
      a microwave transmitting member formed of a dielectric material and facing the processing container configured to transmit the microwaves radiated from the antenna, and form an electric field for generating surface wave plasma by the microwaves;
   a sensor provided in the microwave transmitter and configured to monitor electron temperature of the generated plasma; and
   a controller configured to determine a plasma ignition state based on the electron temperature of the plasma monitored by the sensor,
   wherein a tip of the sensor is embedded in the microwave transmitting member without being exposed to the processing container.

2. The plasma processing apparatus according to claim 1, wherein N microwave transmitters are disposed in a circumferential direction of a ceiling plate of the processing container, wherein N≥2, M sensors are provided, wherein M equals to N or a multiple of N, and the controller determines the plasma ignition states corresponding to the N microwave transmitters based on the electron temperature of the plasma monitored by the M sensors.

3. The plasma processing apparatus according to claim 1, wherein the sensor is coated with an insulating material.

4. The plasma processing apparatus according to claim 1, wherein assuming that a height Z0 of an inner surface of a ceiling plate of the processing container is 0, an electron temperature of the plasma measured by the sensor at the height Z0 is Te0, a distance from the inner surface of the ceiling plate to a workpiece is Z, and pressure in the processing container is p, the controller corrects the electron temperature Te0 of the plasma measured by the sensor to an electron temperature Te(Z) of the plasma on the workpiece based on the following Equation 1, and controls a distribution of the plasma based on the corrected electron temperature Te(Z) of the plasma.

$$\begin{cases} Te(z) = Te_0 e^{-\alpha z} \\ \alpha(p) = -0.018\ln(p[Torr]) + 0.1235 \end{cases} \quad (1)$$

5. The plasma processing apparatus according to claim 4, wherein assuming that a height ZO of an inner surface of a ceiling plate of the processing container is 0, electron density of the plasma measured by the sensor at the height ZO is NeO, a distance from the inner surface of the ceiling plate to a workpiece is Z, and pressure in the processing container is p, the controller corrects the electron density Ne0 of the plasma measured by the sensor to electron density Ne(Z) of the plasma on the workpiece based on the following Equation 2, and controls a distribution of the plasma based on the corrected electron density Ne(Z) of the plasma.

$$Ne\{z\} = Ne_0(1 - e^{-\beta z})e^{-\varsigma z} \quad (2)$$

$$\beta(p) = 0.0056 e^{0.798 p[torr]}$$

$$\varsigma(p) = 0.00891 \ln(p[Torr]) + 0.0612.$$

6. The plasma processing apparatus according to claim 5, wherein the controller controls at least any one of power and a phase of the microwaves radiated to the microwave transmitter based on corrected electron temperature Te(Z) of the plasma and corrected electron density Ne(Z) of the plasma.

7. The plasma processing apparatus according to claim 1, wherein assuming that a height Z0 of an inner surface of a ceiling plate of the processing container is 0, electron density of the plasma measured by the sensor at the height Z0 is Ne0, a distance from the inner surface of the ceiling plate to a workpiece is Z, and pressure in the processing container is p, the controller corrects the electron density Ne0 of the plasma measured by the sensor to electron density Ne(Z) of the plasma on the workpiece based on the following Equation 2, and controls a distribution of the plasma based on the corrected electron density Ne(Z) of the plasma $$Ne\{z\} = Ne_0(1 - e^{-\beta z})e^{-\varsigma z} \quad (2)$$

$$\beta(p) = 0.0056 e^{0.798 p[torr]}$$

$$\varsigma(p) = 0.00891 \ln(p[Torr]) + 0.0612.$$

8. A control method of controlling plasma using a plasma processing apparatus including a microwave transmitter configured to radiate microwaves output from a microwave power source into a processing container,
   wherein the microwave transmitter includes:
      an antenna configured to radiate the microwaves;
      a microwave transmitting member formed of a dielectric material and facing the processing container configured to transmit the microwaves radiated from the antenna, and form an electric field for generating surface wave plasma by the microwaves;
   a sensor provided in the microwave transmitter and configured to monitor electron temperature of the generated plasma; and
   a controller configured to determine a plasma ignition state based on the electron temperature of the plasma monitored by sensor, the control method comprising:
      determining a plasma ignition state based on the electron temperature of the plasma monitored by the sensor,
   wherein a tip of the sensor is embedded in the microwave transmitting member without being exposed to processing container.

* * * * *